(12) United States Patent
Donkers et al.

(10) Patent No.: US 8,871,599 B2
(45) Date of Patent: Oct. 28, 2014

(54) METHOD OF MANUFACTURING IC COMPRISING A BIPOLAR TRANSISTOR AND IC

(75) Inventors: Johannes Josephus Theodorus Marinus Donkers, Valkenswaard (NL); Petrus Hubertus Cornelis Magnee, Malden (NL); Blandine Duriez, Brussels (BE); Evelyne Gridelet, Omal (BE); Hans Mertens, Leuven (BE); Tony Vanhoucke, Bierbeek (BE)

(73) Assignee: NXP, B.V., Eindhoven (NL)

( * ) Notice: Subject to any disclaimer, the term of this patent is extended or adjusted under 35 U.S.C. 154(b) by 26 days.

(21) Appl. No.: 13/599,389

(22) Filed: Aug. 30, 2012

(65) Prior Publication Data

US 2013/0056855 A1 Mar. 7, 2013

(30) Foreign Application Priority Data

Sep. 2, 2011 (EP) .................................... 11179935

(51) Int. Cl.
*H01L 21/331* (2006.01)
*H01L 21/8249* (2006.01)
*H01L 29/737* (2006.01)

(52) U.S. Cl.
CPC ........ *H01L 21/8249* (2013.01); *H01L 29/7378* (2013.01)
USPC ........... 438/312; 438/313; 438/309; 438/205; 257/565; 257/592

(58) Field of Classification Search
CPC ...................... H01L 29/66242; H01L 29/7378; H01L 29/0821; H01L 21/8249; H01L 21/02381; H01L 27/0623
USPC .......... 438/312–313, 309, 205, 353; 257/565, 257/592, E29.174
See application file for complete search history.

(56) References Cited

U.S. PATENT DOCUMENTS

| 8,133,791 B2 * | 3/2012 | Hijzen et al. ................... 438/312 |
| 2001/0053584 A1 | 12/2001 | Chantre et al. |
| 2012/0001192 A1 | 1/2012 | Fox et al. |

FOREIGN PATENT DOCUMENTS

| WO | 03/100845 A1 | 12/2003 |
| WO | 2008/001249 A1 | 1/2008 |
| WO | 2010/066630 A1 | 6/2010 |

OTHER PUBLICATIONS

Van Noort, W.D. et al. "BiCMOS Technology Improvements for Microwave Application", IEEE Bipolar/BiCMOS Circuits and Technology Meeting, pp. 93-96 (Oct. 2008).
Chevalier, P. et al. "A Conventional Double-Polysilicon FSA-SEG Si/SiGe:C HBT Reaching 400 GHz $f_{MAX}$", IEEE Biopolar/BiCMOS Circuits and Technology Meeting, pp. 1-4 (Oct. 2009).

(Continued)

*Primary Examiner* — Theresa T Doan

(57) ABSTRACT

Disclosed is an integrated circuit and a method of manufacturing an integrated circuit comprising a bipolar transistor, the method comprising providing a substrate comprising a pair of isolation regions separated by an active region comprising a collector; forming a base layer stack over said substrate; forming a migration layer having a first migration temperature and an etch stop layer; forming a base contact layer having a second migration temperature; etching an emitter window in the base contact layer, thereby forming cavities extending from the emitter window; and exposing the resultant structure to the first migration temperature in a hydrogen atmosphere, thereby filling the cavities with the migration layer material.

13 Claims, 4 Drawing Sheets

(56) References Cited

OTHER PUBLICATIONS

Vanhoucke, T. et al. "Layout and Spacer Optimization for High-Frequency Low-Noise Performance in HBT's", IEEE Bipolar/BiCMOS Circuits and Technology Meeting, 4 pgs. (2010).

Lin, D.-W. et al. "An Extreme Surface Proximity Push for Embedded SiGe in pMOSFETs Featuring Self-Aligned Silicon Reflow", IEEE Electron Device Letters, vol. 31, No. 9, pp. 924-926, (Sep. 2010).
European Extended Search Report for EP Patent Appln. 11179935.9 (Feb. 9, 2012).

\* cited by examiner

METHOD OF MANUFACTURING IC COMPRISING A BIPOLAR TRANSISTOR AND IC

CROSS-REFERENCE TO RELATED APPLICATIONS

This application claims the priority under 35 U.S.C. §119 of European patent application no. 11179935.9, filed on Sep. 2, 2011, the contents of which are incorporated by reference herein.

FIELD OF THE INVENTION

The invention relates to a method of manufacturing an integrated circuit comprising a bipolar transistor.

The present invention further relates to an integrated circuit comprising a bipolar transistor.

BACKGROUND OF THE INVENTION

Nowadays, many electronic devices incorporate functionality that operates at radio frequencies, such as mobile communication devices. The implementation of such functionality in a cost-effective manner is far from trivial. It is well-known that bipolar transistors are particularly suitable for handling signals in the radio frequency (RF) domain. However, the manufacture of integrated circuits (ICs) based on silicon bipolar transistor technology is more costly than for instance complementary metal oxide semiconductor (CMOS) ICs, and the downscaling of the device feature size is more easily achieved in CMOS technology. The cost-effective nature of CMOS technology has led to the acceptance of CMOS technology as the mainstream technology of choice for the manufacture of a wide variety of semiconductor components including ICs.

However, the breakdown characteristics of CMOS transistors limit the usefulness of CMOS transistors in RF applications unless costly measures are implemented in the CMOS process to improve these characteristics. Such costly measures typically prohibit the use of RF-CMOS technologies for manufacturing small volume devices such as analog mixed signal (AMS) devices. For these reasons, efforts have been made to produce bipolar transistors using a CMOS process flow, thereby providing mixed technology ICs in which bipolar transistors can be used for handling RF signals. An example of such an IC is provided in WO2010/066630 A1.

The challenge that process developers face is that the number of alterations to the CMOS process should remain small whilst at the same time yielding good quality bipolar transistors that are capable of handling high frequency signals. An example of a low-complexity IC including a heterojunction bipolar transistor formed in a CMOS process flow can for instance be found in WO 2003/100845 A1.

Figure 1:
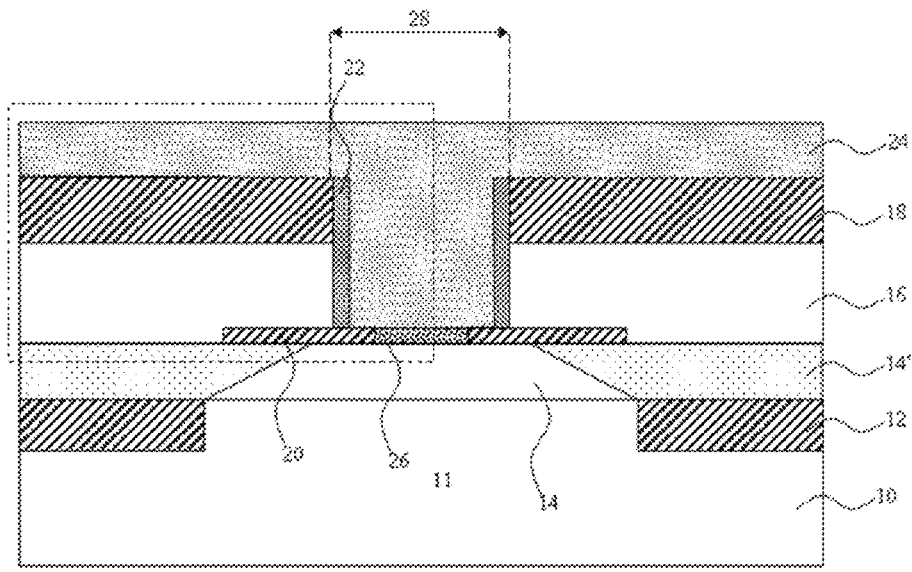

An example of such a bipolar transistor is shown in FIG. 1, and comprises a silicon substrate 10 including an active region 11 in which the collector of the bipolar transistor is formed, e.g. by provision of a buried layer in the substrate 10 or by implantation of an impurity into the substrate 10. The active region 11 is defined in between isolation regions 12, e.g. shallow trench isolation (STI) regions. The bipolar transistor further comprises a layer stack including an epitaxially grown base layer, which grows as a monocrystalline region 14 over the silicon substrate 10 and as a polycrystalline region 14' over the isolation regions 12. A nitride layer (not shown) may be present on the isolation regions 12 to promote epitaxial growth of the base layer portion 14'.

A polysilicon base contact layer 16 is present on the base layer, which is covered by an electrically insulating layer 18. An emitter window 28 is defined over the active region 11, in which an emitter material 24 is formed, e.g. As-doped polysilicon, which is electrically insulated from the base contact layer 16 by sidewall spacers 22 in the emitter window 28 and by the electrically insulating layer 18 for the emitter material 24 deposited outside the emitter window 28, e.g. the emitter contact. The emitter material 24 is electrically insulated from the intrinsic base region 14 by further electrically insulation portions 20, which are typically formed as an etch protection layer to protect the epitaxial base layer during the opening of the emitter window. The outdiffusion 26 of the emitter 24 is surrounded by these portions 20.

The resistance between the intrinsic base portion 14 on the one hand and the extrinsic base portion 14' and polysilicon base contact 16 on the other hand, known as the base-link resistance, is a key contributor to the total base resistance. The reduction of this resistance is a desirable goal as it leads to improved noise and frequency characteristics. It is known that the base-link resistance may be reduced by the lateral downscaling of the sidewall spacers 22 or the tuning of the lateral dimensions of the etch protection layer portions 20. However, as sidewall spacers 22 are already at a minimal thickness in most process technologies, further lateral size reductions are difficult to achieve such that it appears more promising to attempt to reduce the impact of the etch protection layer portions 20 on the base-link resistance.

U.S. patent application 2001/0053584 discloses a method of manufacturing a semiconductor device with a bipolar transistor, in which, on a monocrystalline substrate having STI regions (Shallow Trench Isolation), a number of semiconductor layers are deposited epitaxially for the formation of a base region of the transistor. On top of these semiconductor layers an etch stop layer is deposited covered by a poly crystalline silicon layer and a dielectric layer. An opening is made in these covering layers to form the emitter region. When the etch stop layer is reached, the portion of the etch stop layer covering the opening and adjoining portions of the etch stop layer are removed by means of etching.

A semiconductor layer of silicon and germanium is subsequently deposited uniformly and the hollow obtained from the under etching of the etch stop layer is completely filled up. The SiGe layer on the monocrystalline silicon surface adjoining the opening and in the adjacent hollow underneath the poly crystalline layer has a high-crystalline nature, but the layer has a low-crystalline nature elsewhere. The portion of this SiGe layer adjoining the opening is then removed by selective etching relative to the silicon lying underneath. After this the emitter region is formed by means of the opening. A drawback of the known method is that the RF properties of the devices obtained in this matter are unsatisfactory.

WO 2008/001249 A1 discloses an improvement over this method in that following the formation of the epitaxial base layer stack an etch stop layer is formed over the part of the base layer stack on top of the collector region to protect the base layer stack from the subsequent etching steps to form the emitter window. The base contact layer is subsequently deposited and covered by a silicon nitride layer after which the emitter window is formed by an etching step stopping at the etch stop layer. The etch stop layer is subsequently removed by an anisotropic etch step that at the same time forms cavities at the bottom of the emitter window that extend into the base contact layer. These cavities are subsequently filled by a high temperature treatment at 900° C. in a $H_2$ atmosphere, which causes the migration of some of the polysilicon forming the base contact layer into the cavities, thereby substantially filling these cavities, which reduces the base-link resistance. Alternatively, SiGe may be used for the base contact layer.

However, this approach still suffers from some drawbacks. When using polysilicon as the migratory material, a high temperature of at least 900° C. has to be used to achieve the migration into the cavities, but at such temperatures diffusion of (vertical) doping profiles such as the npn doping profile cannot be avoided, which negatively affects the cut-off frequency $f_T$ of the transistor due to the increase in the major carrier delay times caused by the diffusion of these doping profiles. Alternatively, when using SiGe as the migratory material, the migration can be achieved at lower temperatures, i.e. around 800° C., but as demonstrated in FIG. 2, which depicts a bipolar transistor having a SiGe base contact layer 16 subjected to such a thermal treatment, the smoothness of the sidewalls of the emitter window 28 is negatively affected, which complicates the further processing of the bipolar transistor, thus causing both yield and transistor performance issues.

SUMMARY OF THE INVENTION

The present invention seeks to provide a method of manufacturing an integrated circuit comprising a bipolar transistor, preferably a BICMOS process, in which the base-link resistance can be reduced with less adverse side-effects.

The present invention further seeks to provide an IC comprising such a bipolar transistor.

According to an aspect of the present invention, there is provided a method of manufacturing an integrated circuit comprising a bipolar transistor, the method comprising providing a substrate comprising a pair of first isolation regions separated from each other by an active region comprising a collector impurity said bipolar transistor; forming a base layer stack over said substrate; forming a further stack of a migration layer having a first migration temperature and an etch stop layer over said base layer stack; forming a base contact layer having a second migration temperature over the further stack, the second migration temperature being higher than the first migration temperature; etching an emitter window in the base contact layer over the active region, said etching step terminating at the etch stop layer; at least partially removing the etch stop layer, thereby forming cavities extending from the emitter window in between the base contact layer and the redistribution layer; and exposing the resultant structure to the first migration temperature in a hydrogen atmosphere, thereby filling the cavities with the migration layer material.

By migrating material having a relatively low migration temperature and a lower migration temperature than the material of the base contact layer, fading of the diffusion profiles of the bipolar transistor can be largely avoided, whilst at the same time avoiding deterioration of the emitter sidewall profile. Consequently, a bipolar transistor can be manufactured with improved cut-off frequency characteristics and/or improved manufacturing yield.

In a preferred embodiment, the migration layer comprises SiGe, as this can thermally migrate at temperatures well below the thermal budget typically applied to develop impurity profiles. For instance, SiGe migration can be achieved at a temperature of around 800° C.

The Germanium content of the SiGe migration layer preferably is in the range of 10-30% by weight to ensure that the migration can be achieved at a sufficiently low migration temperature. The SiGe may further comprise an impurity such as boron. Preferably, the base contact layer comprises polycrystalline silicon, which does not migrate at the aforementioned migration temperatures of SiGe, thus ensuring that the emitter window profile remains well-defined.

The etch stop layer may be formed on the migration layer. Alternatively, the migration layer may be formed on the etch stop layer, wherein said etching step further comprises removing the migration layer from over the active region. The latter option is advantageous if the former option suffers from migration material migrating into the emitter window, which can be more effectively prevented if the formation of the emitter window includes removal of the migration material from above the etch stop layer.

According to another aspect of the present invention, there is provided an integrated circuit comprising a substrate comprising a pair of first isolation regions separated from each other by an active region comprising a collector impurity of a bipolar transistor; a base layer stack over said substrate; a further stack of a migration layer having a first migration temperature and an etch stop layer over said base layer stack; a base contact layer having a second migration temperature over the further stack, the second migration temperature being higher than the first migration temperature; and an emitter in the base contact layer over the active region, said emitter being separated from the base contact layer by sidewall spacers; wherein the migration layer comprises portions extending from the base layer stack to the base contact layer, said portions being separated from the emitter by said sidewall spacers.

Such an IC benefits from a bipolar transistor having a reduced base-link resistance whilst at the same time having improved cut-off frequency and/or manufacturability, as explained above. The IC preferably is manufactured in a BICMOS process, i.e. comprises both MOSFETs and bipolar transistors.

BRIEF DESCRIPTION OF THE EMBODIMENTS

Figure 2:
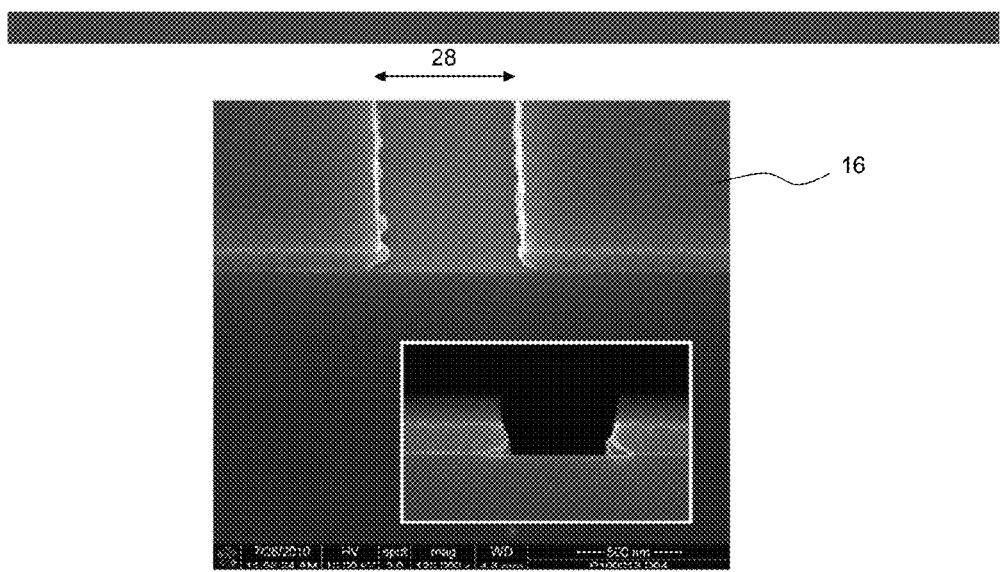
Figure 7:
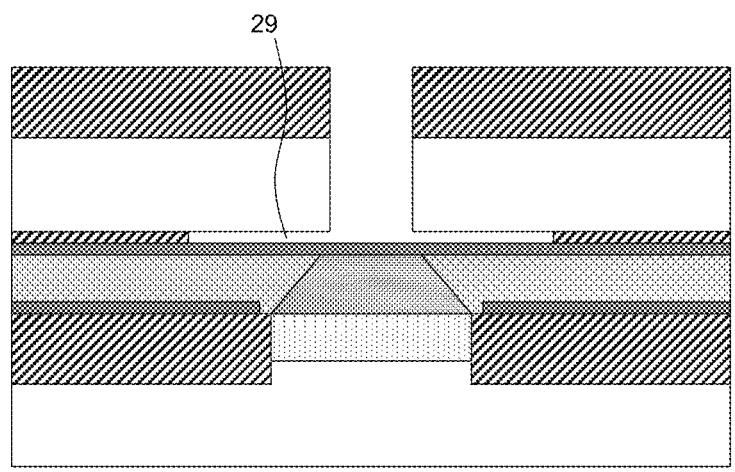
Figure 8:
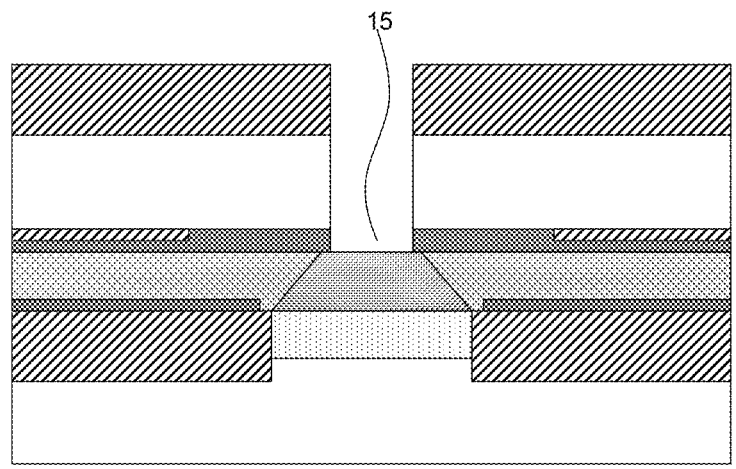
Figure 9:
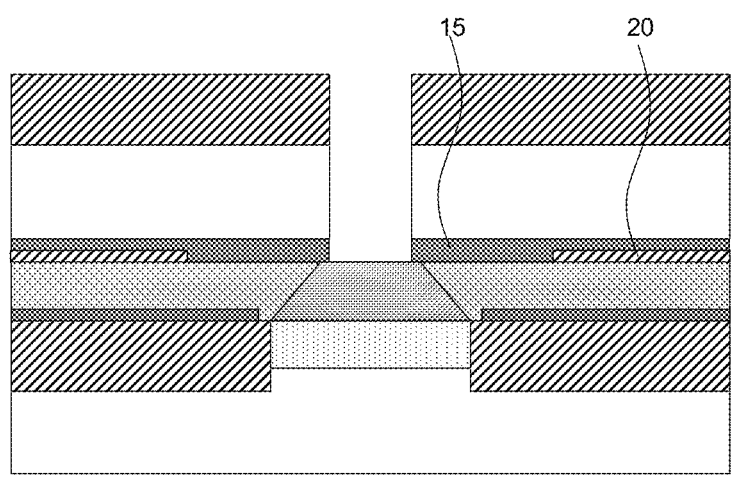

Embodiments of the invention are described in more detail and by way of non-limiting examples with reference to the accompanying drawings, wherein:

FIG. 1 schematically depicts a prior art bipolar transistor;

FIG. 2 show a scanning electron microscopic image of a prior art bipolar transistor;

FIG. 3-8 schematically depict various steps of an IC manufacturing method according to an embodiment of the present invention; and FIG. 9 schematically depicts an aspect of an IC manufacturing method according to an alternative embodiment of the present invention.

DETAILED DESCRIPTION OF THE DRAWINGS

It should be understood that the Figures are merely schematic and are not drawn to scale. It should also be understood that the same reference numerals are used throughout the Figures to indicate the same or similar parts.

Figure 3:
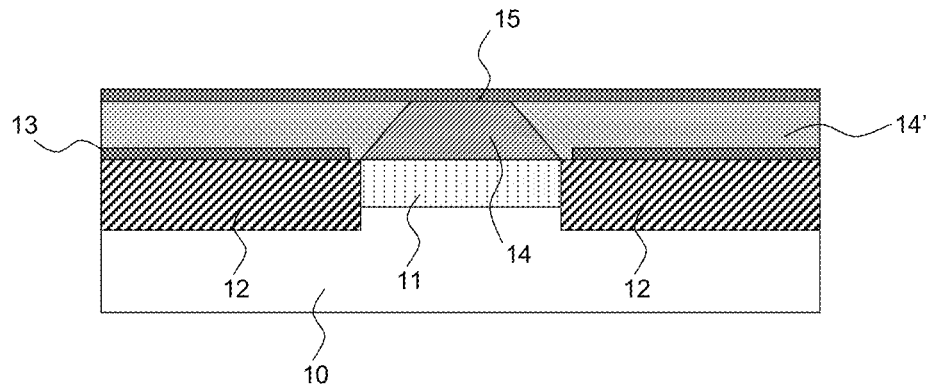

A possible starting point of the method of the present invention is shown in FIG. 3. A substrate 10 including an active region 11 in between isolation regions 12 such as shallow trench isolation regions is provided. The active region typically comprises a collector region, e.g. a buried collector formed by a buried layer grown epitaxially in the substrate 10 or an implanted collector. Any suitable implementation of the collector may be contemplated. A patterned nitride layer 13 may optionally be formed over the isolation regions 12, whilst leaving exposed the active region 11. On this structure, a base layer may be epitaxially grown, resulting in monocrystalline base layer portions 14 growing on the exposed regions of the monocrystalline substrate 10 including the active region 11 and polycrystalline base layer portions 14' on amorphous or polycrystalline surfaces such as the isolation regions 12 and the nitride layer 13 if present.

In a preferred embodiment, the base layer comprises a Si/SiGe:C layer stack, which by way of non-limiting example may be formed as follows. Prior to the growth of the epitaxial base layer, the exposed silicon surfaces may be passivated by a hydrogen bake. The base layer is formed by first growing an undoped Si buffer layer, followed by the growth of an undoped SiGe:C collector-base spacer, a boron-doped SiGe:C base, an undoped SiGe:C base-emitter spacer and a doped Si emitter cap. The carbon content in the SiGe layers preferably is around 0.2% and the germanium content is preferably around 20% in these layers. The carbon in the SiGe:C layers prevents the outdiffusion of boron impurities from the boron-doped base, as is known per se. However, it should be understood that the exact composition and structure of the base in the bipolar transistor of the present invention is not important; any suitable base construction may be chosen.

In accordance with an embodiment of the present invention, a migration layer 15 is subsequently formed on the base layer stack portions 14 and 14'. This migration layer preferably is a low-crystalline or polycrystalline silicon germanium (SiGe) layer. SiGe is a particularly suitable material because it shows pronounced migration characteristics at relatively low temperatures in a hydrogen gas ($H_2$) atmosphere, i.e. during hydrogen anneal. To optimize the migration properties whilst at the same time remaining suitable electrical properties, the Ge content of the SiGe layer is at least 10% by weight, and in preferably chosen within a range of 10-30% by weight, although it is emphasized that weight percentages outside this range may also be chosen.

Figure 4:
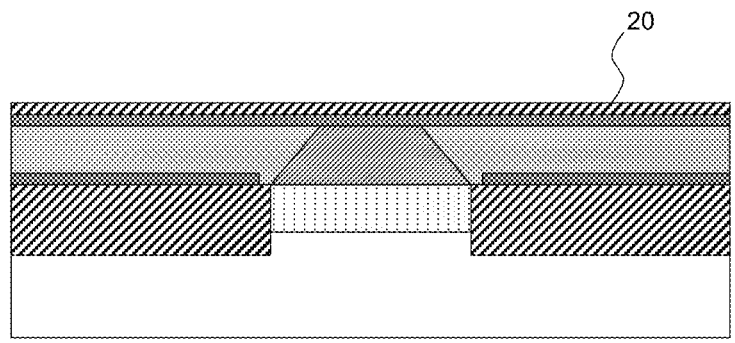

Next, as shown in FIG. 4, an etch protection layer 20 is formed over the migration layer 15. The main purpose of the etch protection layer 20 is to protect the at least the base layer portion 14 from etch recipes capable of oxidizing silicon. Such an etch protection layer may for instance be formed by deposition. A non-limiting example of a suitable material of the etch protection layer is TEOS (tetraethylorthosilicate), although alternative suitable materials, e.g. alternative oxides, will be apparent to the skilled person.

At this stage it is noted that in some embodiments of the present invention (vide infra) the etch protection layer 20 does not require patterning as will be explained in more detail below, thus saving a mask compared to conventional bipolar transistor manufacturing techniques. In some other embodiments (not shown), the etch protection layer 20 may be patterned to its desired dimensions, e.g. by forming a patterned mask over the etch protection layer, removing the exposed parts of the etch protection layer and subsequently removing the mask. Such patterning is well-known to the skilled person and has not been explained in further detail for this reason.

Figure 5:
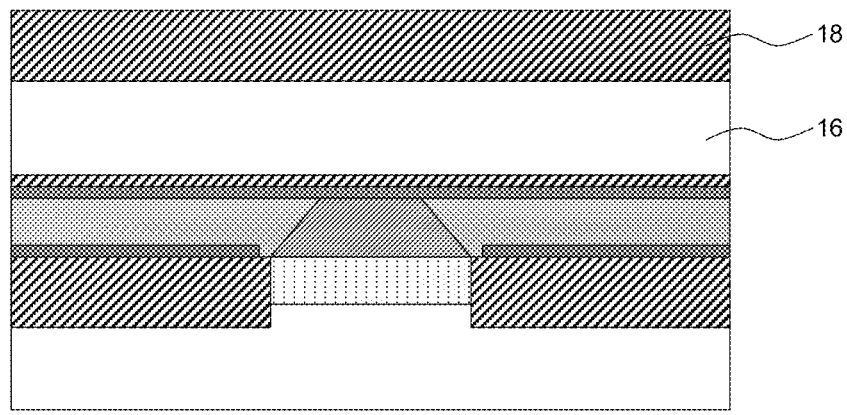

Next, the method proceeds as shown in FIG. 5, in which a base contact layer 16 is grown over the resultant structure in any suitable manner, e.g. by means of a suitable vapor deposition process such as CVD, followed by the formation of an electrically insulating layer 18, which may be any suitable dielectric material, e.g. TEOS. An etch resist layer such as a nitride layer (not shown) may be formed over the electrically insulating layer 18 to protect the layer from etch damage during further processing steps. When using SiGe as the migration material 15, the base contact layer 16 preferably is a polycrystalline silicon layer, as poly-Si shows negligible migration at the typical $H_2$ anneal temperatures of SiGe, e.g. at 800° C.

Figure 6:
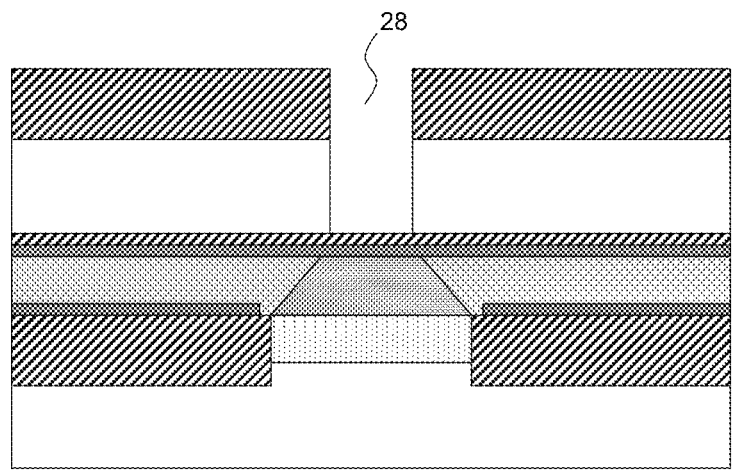

Next, the emitter window 28 is opened as shown in FIG. 6, whilst stopping at the etch stop layer 20. Any suitable etch recipe may be used. In an embodiment, the emitter window etch is performed using a number of selective etch steps to selectively remove the nitride layer if present, a selective etch to remove the dielectric or insulating layer 18, e.g. by using a selective oxide etch, followed by a selective etch to remove the polysilicon base contact layer 16, e.g. using a poly-Si etch recipe including $CF_4$, $Cl_2$, HBr and $O_2$.

Etch protection layer 20 is subsequently removed from the emitter window 28 using a selective etch recipe as shown in FIG. 7. The etch recipe causes an underetch of the etch protection layer 20 underneath the base contact layer 16, thereby forming cavities 29 that laterally extend from the bottom portion of the sidewall of the emitter window 28 and that are located between the base contact layer 16 and the migration layer 15. In case of the etch protection layer 20 being a TEOS layer, a hydrofluoric acid (HF) etch recipe may be used to achieve such an under-etch.

At this stage it is noted that if the dielectric layer 18 is chosen to be a nitride layer, the duration of the HF etch of the TEOS etch protection layer 20 can be extended to create a very wide underetch. In such a case, the patterning of the etch protection layer 20 may be skipped, as it is effectively removed by this etching step instead, thereby saving one mask as previously explained. To avoid an impact on the base resistance contribution between the deposited base contact layer 16 and the base layer stack 14 and 14', such a cavity 29 preferably should have lateral dimensions of 100-200 nm. It is foreseen that such lateral dimensions could potentially cause a collapse of the deposited base contact layer 16 onto the grown base layer including portions 14 and 14'. This, however, is not expected to have any negative side effects, since the hydrogen treatment (vide infra) will effectively seal any voids present.

Next, as shown in FIG. 8, the resultant structure is subjected to a hydrogen anneal step at a suitable temperature, e.g. around 800° C. for a SiGe migration layer 15, which causes the migration layer material to migrate into the cavities 29, thereby reducing the base link resistance of the bipolar transistor to be formed. This includes the migration of the SiGe migration material from the monocrystalline base layer portion 14 towards the polycrystalline portions 14' as shown in FIG. 8. This migration process will also seal any voids resulting from the aforementioned collapse of the deposited base contact layer 16 onto the grown base layer including portions 14 and 14'. At this point, it is noted that the sealing of such voids can be further improved when using a patterned etch stop layer 20, which has not been explicitly shown for the reasons already explained above.

The bipolar transistor may now be finished in any suitable manner, e.g. by the formation of sidewall spacers in the emitter window 28 followed by the deposition of an emitter material in the emitter window 28 and the formation of base, collector and emitter contacts. As many suitable embodiments of these finalizing steps are well-known to the skilled person, they have been omitted for the sake of brevity only.

At this point, it is noted that in the embodiment of the method of the present invention shown in FIG. 3-8, the emitter window etch stops at an etch protection layer 20 located above the migration layer 15, thus leaving the migration layer 15 unpatterned. The portion of the migration layer 15 over the active region 11 of the bipolar transistor may be unwanted in some circumstances, for instance when it causes contamination of the sidewalls of the emitter window 28 during the $H_2$ anneal step.

In an alternative embodiment of the present invention, the migration layer 15 is located above the etch protection layer 20 such that during the etch step in which the emitter window 28 is formed, the portion of the migration layer 15 exposed to this etch recipe is also removed. Consequently, following the removal of the etch protection layer 20 and the subsequent $H_2$ anneal step a resultant structure is formed as shown in FIG. 9, in which the migration layer 15 has migrated into the cavities 29, but is largely absent at the bottom of the emitter window 28.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of manufacturing an integrated circuit comprising a bipolar transistor, the method comprising:
   providing a substrate comprising a pair of first isolation regions separated from each other by an active region comprising a collector impurity of said bipolar transistor;
   forming a base layer stack over said substrate;
   forming a further stack of a migration layer having a first migration temperature and an etch stop layer over said base layer stack;
   forming a base contact layer having a second migration temperature over the further stack, the second migration temperature being higher than the first migration temperature;
   etching an emitter window in the base contact layer over the active region, said etching step terminating at the etch stop layer;
   at least partially removing the etch stop layer, thereby forming cavities extending from the emitter window in between the base contact layer and the migration layer; and
   exposing the resultant structure to the first migration temperature in a hydrogen atmosphere, thereby filling the cavities with the migration layer material;
   wherein the migration layer is formed on the etch stop layer, and wherein said etching step further comprises removing the migration layer from over the active region.

2. The method of claim 1, wherein the migration layer comprises SiGe.

3. The method of claim 2, wherein the Germanium content of the SiGe migration layer is in the range of 10-30% by weight.

4. The method of claim 2, wherein the SiGe comprises an impurity.

5. The method of claim 1, wherein the base contact layer comprises polycrystalline silicon.

6. The method of claim 1, wherein the etch stop layer is formed on the migration layer.

7. The method of claim 6, further comprising patterning the etch stop layer prior to forming the base contact layer.

8. A method of manufacturing an integrated circuit comprising a bipolar transistor, the method comprising:
   providing a substrate comprising a pair of first isolation regions separated from each other by an active region comprising a collector impurity of said bipolar transistor;
   forming a base layer stack over said substrate;
   forming a further stack of a migration layer having a first migration temperature and an unpatterned etch stop layer over said base layer stack, wherein the unpatterned etch stop layer extends over the pair of first isolation regions and the active region;
   forming a base contact layer having a second migration temperature over the further stack including over the unpatterned etch stop layer, the second migration temperature being higher than the first migration temperature;
   etching an emitter window in the base contact layer over the active region, said etching step terminating at the unpatterned etch stop layer;
   at least partially removing the unpatterned etch stop layer, thereby forming cavities extending from the emitter window in between the base contact layer and the migration layer; and
   exposing the resultant structure to the first migration temperature in a hydrogen atmosphere, thereby filling the cavities with the migration layer material.

9. The method of claim 8, wherein the migration layer comprises SiGe.

10. The method of claim 9, wherein the Germanium content of the SiGe migration layer is in the range of 10-30% by weight.

11. The method of claim 9, wherein the SiGe comprises an impurity.

12. The method of claim 8, wherein the base contact layer comprises polycrystalline silicon.

13. The method of claim 8, wherein the etch stop layer is formed on the migration layer.

* * * * *